United States Patent
Cho et al.

(10) Patent No.: US 8,022,541 B2
(45) Date of Patent: Sep. 20, 2011

(54) AU-AG BASED ALLOY WIRE FOR SEMICONDUCTOR PACKAGE

(75) Inventors: Jong Soo Cho, Seoul (KR); Yong Jin Park, Gyeonggi-do (KR); Jeong Tak Moon, Gyeonggi-do (KR); Eun Kyu Her, Gangwon-do (KR); Kyu Hwan Oh, Seoul (KR)

(73) Assignee: MK Electron Co., Ltd., Yongin, Gyeonngi-Do (KR)

( * ) Notice: Subject to any disclaimer, the term of this patent is extended or adjusted under 35 U.S.C. 154(b) by 261 days.

(21) Appl. No.: 11/752,729

(22) Filed: May 23, 2007

(65) Prior Publication Data

US 2007/0278634 A1    Dec. 6, 2007

(30) Foreign Application Priority Data

May 30, 2006  (KR) .................. 10-2006-0049017

(51) Int. Cl.
*H01L 23/48*  (2006.01)

(52) U.S. Cl. ........ 257/741; 257/690; 257/784; 420/508; 420/511; 420/509

(58) Field of Classification Search .................. 257/784, 257/734, 677; 420/508, 511, 509
See application file for complete search history.

(56) References Cited

U.S. PATENT DOCUMENTS

| 5,538,685 | A * | 7/1996 | Toyofuku et al. ............. 420/463 |
| 2003/0209810 | A1 * | 11/2003 | Moon et al. .................. 257/784 |

FOREIGN PATENT DOCUMENTS

| JP | 10326803 | 8/1998 |
| JP | 11067811 | 9/1999 |
| JP | 2000-150562 | 5/2000 |
| KR | 07-335686 | 12/1995 |
| KR | 11-284009 | 10/1999 |

* cited by examiner

*Primary Examiner* — Marcos D. Pizarro
*Assistant Examiner* — Eva Yan Montalvo
(74) *Attorney, Agent, or Firm* — Volpe and Koenig, P.C.

(57) ABSTRACT

A gold-silver based wire for a semiconductor package has high humidity reliability as well as high dry reliability. The wire includes a first additive ingredient that contains 5~15 wt % of at least one kind of elements from among first group elements composed of palladium (Pd) and platinum (Pt) added to a gold (Au)-silver (Ag) based alloy that contains 10~40 wt % of Ag added to Au.

17 Claims, 2 Drawing Sheets
(1 of 2 Drawing Sheet(s) Filed in Color)

US 8,022,541 B2

AU-AG BASED ALLOY WIRE FOR SEMICONDUCTOR PACKAGE

CROSS-REFERENCE TO RELATED PATENT APPLICATION

This application claims the benefit of Korean Patent Application No. 10-2006-0049017, filed on May 30, 2006, in the Korean Intellectual Property Office, the disclosure of which is incorporated herein in its entirety by reference.

BACKGROUND OF THE INVENTION

1. Field of the Invention

The present invention relates to a wire for electrically connecting a semiconductor chip to a semiconductor substrate, e.g., a lead frame to a printed circuit board, when fabricating a semiconductor package, and more particularly to a gold (Au)-silver (Ag) based alloy wire.

2. Description of the Related Art

Conventionally, Au has been used for forming wires for semiconductor packages. However, in order to decrease the fabrication costs in the semiconductor industry and cope with the recent increases in a gold price, Au—Ag alloy wires have been newly used. Since Ag forms a complete solid solution when combined with Au, such alloys can be mass produced to decrease the fabrication costs of wires for semiconductor packages.

Studies on conventional Au—Ag alloy wires have been disclosed in Japanese Patent laid-open Application Nos. 1998-326803, 1999-67811 and 2000-150562. However, such Au—Ag alloy wires are stable to a dry reliability test but significantly unstable to a high humidity reliability test dissimilar to general Au wires.

For example, reliability standards in the semiconductor industry include a high temperature storage life time test (HTST), a highly accelerated temperature & humidity storage test (HAST), a pressure cooker test (PCT), a temperature humidity test (TH) and a temperature cycle test (TC). Among these tests, the HTST or the TC are examples of the dry reliability test, and the HAST, the PCT, and the TH are examples of the high humidity reliability test.

Referring to FIG. 1, an Au wire has a high bonding strength in both the dry reliability test and the high humidity reliability test. However, an Au—Ag alloy wire has a higher bonding strength in the dry reliability test than in an initial period, but has a considerably weak bonding strength in the high humidity reliability test. That is, the Au—Ag alloy wire is very vulnerable to the high humidity test.

Referring to FIG. 2, a semiconductor chip 120 is stacked on a package substrate 110, and pads 125 of the semiconductor chip 120 and external terminals (not shown) of the package substrate 110 are connected by wires 130 and balls 135 of the wires 130. In this case, many of the Au—Ag alloy wires 130 are detached from the pad 125 of the semiconductor chip 120 during a high humidity reliability test, e.g., a PCT. Such poor humidity reliability is a significant obstacle to the use of Au—Ag alloy wires for semiconductor packages despite their low cost.

SUMMARY OF THE INVENTION

The present invention provides an Au—Ag based alloy wire for a semiconductor package having high humidity reliability as well as high dry reliability.

According to an aspect of the present invention, there is provided a wire for a semiconductor package comprising a first additive ingredient that contains 5~15 wt % of at least one kind of elements selected from among first group elements composed of palladium (Pd) and platinum (Pt) added to a gold (Au)-silver (Ag) based alloy that contains 10~40 wt % of Ag added to Au.

The wire further comprises a second additive ingredient that contains 10~5000 wt·ppm of at least one kind of elements from among second group elements composed of nickel (Ni), tin (Sn), niobium (Nb), molybdenum (Mo), technetium (Tc), ruthenium (Ru), Rhodium (Rh), Vanadium (V), and cobalt (Co) added to the Au—Ag based alloy.

The wire further comprises a third additive ingredient that contains 5~150 wt·ppm of at least one kind of elements from among third group elements composed of lanthanum (La), cerium (Ce), calcium (Ca), magnesium (Mg), strontium (Sr) and barium (Ba) added to the Au—Ag alloy.

In this case, a ratio of the first additive ingredient with respect to Ag ranges from 1/4 to 1/2.

BRIEF DESCRIPTION OF THE DRAWINGS

The patent application file contains at least one drawing executed in color. Copies of this patent or patent application publication with color drawing(s) will be provided by the Office upon request and payment of the necessary fee.

The above and other features and advantages of the present invention will become more apparent by describing in detail exemplary embodiments thereof with reference to the attached drawings in which.

DETAILED DESCRIPTION OF THE INVENTION

Figure 1:
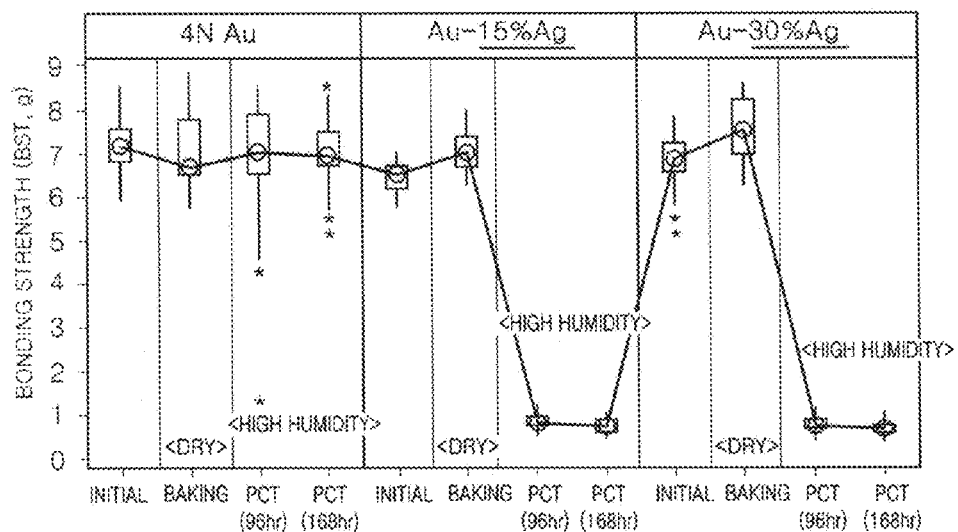
FIG. 1 is a graph illustrating a variation of a bonding strength in a reliability test of a conventional semiconductor package having Au wires and Au—Ag alloy wires.
Figure 2:
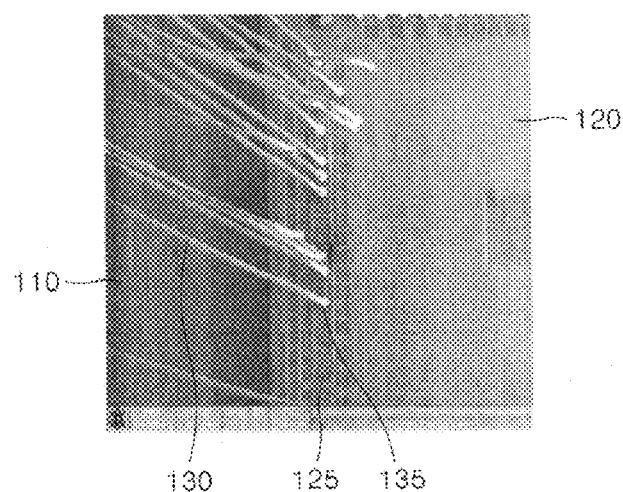
FIG. 2 is a photograph showing a conventional Au—Ag alloy wire during a reliability test.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In the present invention, wt·ppm and wt % respectively represent weight ppm and weight percent of alloy ingredients or additive ingredients with respect to a total weight of a wire.

A wire for a semiconductor package according to the embodiments of the present invention is used for bonding a semiconductor chip to a package substrate. Thus, the wire according to the embodiments of the present invention can be referred to as a bonding wire. The wire is formed by adding a predetermined amount of ingredients to a highly pure Au—Ag based alloy. The wire possibly includes impurities unavoidably contained when refining or forming an alloy of Au and Ag. Therefore, the scope of the present invention is not limited to whether impurities are unavoidably included or not.

One of the reasons for using the Au—Ag based alloy as a main substance instead of conventionally-used Au is to decrease the fabrication costs. Because Au has small electrical resistance, Au is a good conductor for transmitting signals in electronic circuits. Also, Au has excellent softness and viscosity so that it can be easily elongated or widened. However, since Au is expensive and thereby leads to an increase of the fabrication costs of wires for a semiconductor package, the Au—Ag based alloy wire of the present invention is useful in view of the fabrication costs.

Along with the cost-down advantage, Ag content in the Au—Ag based alloy wires can be properly adjusted to secure good electrical characteristics and reliability for interconnects in a semiconductor package. For example, the Au—Ag based alloy of the present invention may be obtained by adding Ag of 10~40 wt % to highly pure Au of at least 99.99% (4N). The highly pure Au may be obtained by double refining or electrochemical refining and local fusing refining so as to increase the purity by eliminating the impurities.

According to an embodiment of the present invention, a wire for a semiconductor package may include a first additive ingredient added to the Au—Ag based alloy. The first additive ingredient includes at least one kind of elements selected from among first group elements composed of palladium (Pd) and platinum (Pt). The content of the first additive ingredient may be appropriately selected by considering the reliability, especially, the high humidity reliability, of the wire. According to various experiments, the content of the first additive ingredient may be 5~15 wt % so as to secure the high humidity reliability without degrading other reliabilities.

Furthermore, the first additive ingredients may impede diffusion of atoms of Au and Ag in bonding interfaces of pads and wires of semiconductor chips. Accordingly, because the diffusion of Au and Ag is blocked, forming of intermetallic compound (IMC) and forming of Kirkendall voids at the bonding interfaces are prevented. As a result, thermal reliability of the semiconductor package can be increased. Also, the first additive ingredients have an excellent oxidation-resistance to improve a tensile force of the wire at a normal temperature, and a tolerance at a high temperature of the wire during many times of thermal annealing accompanied to semiconductor packaging.

According to another embodiment of the present invention, the wire may further include a second additive ingredient in addition to the above-stated first additive ingredient included in the Au—Ag based alloy. The second additive ingredient includes at least one kind of elements selected from among second group elements composed of nickel (Ni), tin (Sn), niobium (Nb), molybdenum (Mo), technetium (Tc), ruthenium (Ru), rhodium (Rh), vanadium (V), and cobalt (Co). The content of the second additive ingredient may be appropriately selected to further improve the reliability, especially, the high humidity reliability, of the semiconductor package.

Particularly, the second additive ingredient added to the first additive ingredient has a synergistic effect. Various experiments showed that the content of the second additive ingredient may be 10~5000 wt·ppm so as to secure enough high humidity reliability without degrading other reliabilities.

According to another embodiment of the present invention, the wire may further include a third additive ingredient in addition to the first additive ingredient included in the Au—Ag based alloy, or both the second additive ingredient and the third additive ingredient. The third additive ingredient includes at least one kind of elements selected from among third group elements composed of lanthanum (La), cerium (Ce), calcium (Ca), magnesium (Mg), strontium (Sr) and barium (Ba). The content of the third additive ingredient may be appropriately selected to further improve the reliability, especially, the high humidity reliability, of the semiconductor package.

Particularly, the third additive ingredient incites a synergistic effect by being added to the first additive ingredient and/or the second additive ingredient. Various experiments showed that the content of the third additive ingredient may be 5~150 wt·ppm so as to secure enough high humidity reliability without degrading other reliabilities.

In the above-described embodiments, a ratio of the first additive ingredient to Ag may be appropriately selected by considering the fabrication costs and the reliability of the semiconductor package. The reliability of the semiconductor package can be secured even if the content of the first additive ingredient is small in case that the content of Au is not high in the wire. For example, a ratio of the first additive ingredient to Ag may range from 1/4~1/2.

Hereinafter, results of reliability tests of the semiconductor package including the Au—Ag based alloy wire formed by varying the contents of the additive ingredients will be described in more detail. However, the following embodiments are provided not for limiting the scope of the present invention but for a better understanding thereof.

The additive ingredients included in the alloy were mixed and fused into the highly purified Au as indicated in Table 1 below, and the alloy was consecutively cast to form a gold rod. Then, a wire having a target diameter was obtained using a drawing process. The diameter of the wire was 25 μm. Thereafter, annealing was performed to remove an internal stress field within the wire and a wire curl.

TABLE 1

| Classification | | Ag (Wt %) | 1st group (wt %) | | 2nd group (wt. ppm) | | | | | | |
|---|---|---|---|---|---|---|---|---|---|---|---|
| | | | Pd | Pt | Ni | Sn | Nb | Mo | Tc | Ru | Rh |
| Exemplary Embodiments | 1 | 15 | 1 | | | | | | | | |
| | 2 | 15 | 5 | | | | | | | | |
| | 3 | 15 | 10 | | | | | | | | |
| | 4 | 15 | 15 | | | | | | | | |
| | 5 | 15 | 20 | | | | | | | | |
| | 6 | 30 | 1 | | | | | | | | |
| | 7 | 30 | 5 | | | | | | | | |
| | 8 | 30 | 10 | | | | | | | | |
| | 9 | 30 | 15 | | | | | | | | |
| | 10 | 30 | 20 | | | | | | | | |
| | 11 | 15 | | 1 | | | | | | | |
| | 12 | 15 | | 5 | | | | | | | |
| | 13 | 15 | | 10 | | | | | | | |
| | 14 | 15 | | 15 | | | | | | | |

TABLE 1-continued

| Classification | # | | | | V | Co | La | Ce | Ca | Mg | Sr | Ba | Ti |
|---|---|---|---|---|---|---|---|---|---|---|---|---|---|
| Exemplary Embodiments | 15 | 15 | | 20 | | | | | | | | | |
| | 16 | 30 | | 1 | | | | | | | | | |
| | 17 | 30 | | 5 | | | | | | | | | |
| | 18 | 30 | | 10 | | | | | | | | | |
| | 19 | 30 | | 15 | | | | | | | | | |
| | 20 | 30 | | 20 | | | | | | | | | |
| | 21 | 10 | 5 | | | | | | | | | | |
| | 22 | 10 | | 5 | | | | | | | | | |
| | 23 | 40 | 15 | | | | | | | | | | |
| | 24 | 40 | | 15 | | | | | | | | | |
| | 25 | 15 | 5 | | 5 | | | | | | | | |
| | 26 | 15 | 5 | | 10 | | | | | | | | |
| | 27 | 15 | 5 | | 100 | | | | | | | | |
| | 28 | 15 | 5 | | 1000 | | | | | | | | |
| | 29 | 15 | 5 | | 5000 | | | | | | | | |
| | 30 | 15 | 5 | | $10^4$ | | | | | | | | |
| | 31 | 15 | 5 | | 1000 | 1000 | | | | | | | |
| | 32 | 15 | 5 | | | | 1000 | | | | | | |
| | 33 | 15 | 5 | | | | | 1000 | | | | | |
| | 34 | 15 | 5 | | 1000 | | | | | 1000 | | | |
| | 35 | 15 | 5 | | | | | | | | 1000 | | |
| | 36 | 15 | 5 | | | | | | | | | | 1000 |
| | 37 | 15 | 5 | | 1000 | | | | | | | | |
| | 38 | 15 | 5 | | | | | | | | | | |
| | 39 | 30 | 10 | | 1000 | | | | | | | | |
| | 40 | 30 | 10 | | | | | | | 1000 | | | |
| | 41 | 30 | 10 | | | 1000 | | | | 1000 | | | 1000 |
| | 42 | 30 | 10 | | | | | | | 1000 | | | |
| | 43 | 30 | 10 | | 1000 | | | | | | | | |
| | 44 | 30 | 10 | | 1000 | | | | | | | | |
| | 45 | 30 | 15 | | 5000 | | | | | | | | |
| | 46 | 15 | 5 | | 1000 | | | | | | | | |
| | 47 | 15 | | | 5 | | 500 | | | | | | |
| | 48 | 15 | 10 | | | 1000 | | | | | | | |
| | 49 | 15 | | | 10 | 500 | | | | | | | |
| | 50 | 30 | 10 | | | 500 | | | | | | | |
| Comparison | 51 | | | | | | | | | | | | |
| | 52 | 15 | | | | | | | | | | | |
| | 53 | 30 | | | | | | | | | | | |
| | 54 | 15 | 1 | | | | | | | | | | |
| | 55 | 15 | 3 | | | | | | | | | | |
| | 56 | 30 | | 1 | | | | | | | | | |
| | 57 | 30 | | 3 | | | | | | | | | |

| | | 2nd group (wt. ppm) | | 3rd group (wt. ppm) | | | | | | |
|---|---|---|---|---|---|---|---|---|---|---|
| Classification | | V | Co | La | Ce | Ca | Mg | Sr | Ba | Ti |
| Exemplary Embodiments | 1 | | | | | | | | | |
| | 2 | | | | | | | | | |
| | 3 | | | | | | | | | |
| | 4 | | | | | | | | | |
| | 5 | | | | | | | | | |
| | 6 | | | | | | | | | |
| | 7 | | | | | | | | | |
| | 8 | | | | | | | | | |
| | 9 | | | | | | | | | |
| | 10 | | | | | | | | | |
| | 11 | | | | | | | | | |
| | 12 | | | | | | | | | |
| | 13 | | | | | | | | | |
| | 14 | | | | | | | | | |
| | 15 | | | | | | | | | |
| | 16 | | | | | | | | | |
| | 17 | | | | | | | | | |
| | 18 | | | | | | | | | |
| | 19 | | | | | | | | | |
| | 20 | | | | | | | | | |
| | 21 | | | | | | | | | |
| | 22 | | | | | | | | | |
| | 23 | | | | | | | | | |
| | 24 | | | | | | | | | |
| | 25 | | | | | | | | | |
| | 26 | | | | | | | | | |
| | 27 | | | | | | | | | |
| | 28 | | | | | | | | | |
| | 29 | | | | | | | | | |
| | 30 | | | | | | | | | |
| | 31 | | | | | | | | | |
| | 32 | | | | | | | | | |

TABLE 1-continued

| Classification | No. | C1 | C2 | C3 | C4 | C5 | C6 |
|---|---|---|---|---|---|---|---|
| | 33 | | | | | | |
| | 34 | | | | | | |
| | 35 | | | | | | |
| | 36 | | | | | | |
| | 37 | 1000 | | | | | |
| | 38 | | 1000 | | | | |
| | 39 | | | | | | |
| | 40 | | | | | | |
| | 41 | | | | | | |
| | 42 | | 1000 | | | | |
| | 43 | | | 3 | | | |
| | 44 | | | 100 | | | |
| | 45 | | | 500 | | | |
| | 46 | | | 1 | | | |
| | 47 | | | 5 | | 5 | |
| | 48 | | | | 10 | | 50 |
| | 49 | | | | 50 | 100 | |
| | 50 | | | 500 | | 10 | 10 |
| Comparison | 51 | | | 10 | | 10 | |
| | 52 | | | | | | |
| | 53 | | | | | | |
| | 54 | | | | | | |
| | 55 | | | | | | |
| | 56 | | | | | | |
| | 57 | | | | | | |

The results of the reliability tests for the semiconductor package including the wire fabricated as indicated in Table 1 are shown in Table 2. In Table 2, the unit of the bonding strength is g (gram) and the bonding strength was obtained before and after the PCT using a Ball Shear Test (BST). In Table 2, "⊚" denotes excellent bonding strength, "○" denotes good bonding strength, "Δ" denotes normal bonding strength, and "X" denotes bad bonding strength. Also, ball hardness was measured based on micro Vickers hardness measuring upon a section of the ball.

TABLE 2

| Classification | | Bonding strength (BST, g) | | | | Ball hardness (Hv) | Chip crack | Shrinkage cavity |
|---|---|---|---|---|---|---|---|---|
| | | Before PCT | After PCT | Decreased Rate | Reliability | | | |
| Exemplary Embodiments | 1 | 6.5 | 1.5 | 77% | X | 63 | None (X) | None (X) |
| | 2 | 6.6 | 4.7 | 29% | ⊚ | 64 | None (X) | None (X) |
| | 3 | 6.7 | 5.0 | 25% | ⊚ | 66 | None (X) | None (X) |
| | 4 | 6.7 | 5.1 | 24% | ⊚ | 67 | None (X) | None (X) |
| | 5 | 5.0 | 3.9 | 22% | ⊚ | 72 | Produced (○) | None (X) |
| | 6 | 6.4 | 1.2 | 81% | X | 64 | None (X) | None (X) |
| | 7 | 6.5 | 3.9 | 40% | ○ | 64 | None (X) | None (X) |
| | 8 | 6.5 | 4.8 | 26% | ⊚ | 66 | None (X) | None (X) |
| | 9 | 6.7 | 5.0 | 25% | ⊚ | 68 | None (X) | None (X) |
| | 10 | 5.1 | 3.4 | 33% | ○ | 73 | Produced (○) | None (X) |
| | 11 | 6.4 | 1.3 | 80% | X | 63 | None (X) | None (X) |
| | 12 | 6.5 | 4.4 | 32% | ○ | 65 | None (X) | None (X) |
| | 13 | 6.5 | 4.8 | 26% | ⊚ | 65 | None (X) | None (X) |
| | 14 | 6.6 | 5.0 | 24% | ⊚ | 67 | None (X) | None (X) |
| | 15 | 4.8 | 3.3 | 31% | ○ | 73 | Produced (○) | None (X) |
| | 16 | 6.3 | 1.0 | 84% | X | 66 | None (X) | None (X) |
| | 17 | 6.4 | 3.8 | 41% | ○ | 67 | None (X) | None (X) |
| | 18 | 6.6 | 4.5 | 32% | ○ | 68 | None (X) | None (X) |
| | 19 | 6.8 | 5.0 | 26% | ⊚ | 70 | None (X) | None (X) |
| | 20 | 7.3 | 4.3 | 41% | ○ | 74 | Produced (○) | None (X) |
| | 21 | 6.4 | 4.8 | 25% | ⊚ | 63 | None (X) | None (X) |
| | 22 | 6.3 | 4.7 | 25% | ⊚ | 63 | None (X) | None (X) |
| | 23 | 7.2 | 5.1 | 29% | ⊚ | 68 | None (X) | None (X) |
| | 24 | 7.2 | 5.0 | 31% | ○ | 68 | None (X) | None (X) |
| | 25 | 6.6 | 4.6 | 30% | ⊚ | 64 | None (X) | None (X) |
| | 26 | 6.6 | 4.8 | 27% | ⊚ | 64 | None (X) | None (X) |
| | 27 | 6.6 | 4.8 | 27% | ⊚ | 65 | None (X) | None (X) |
| | 28 | 6.7 | 4.9 | 27% | ⊚ | 66 | None (X) | None (X) |
| | 29 | 6.8 | 4.9 | 28% | ⊚ | 68 | None (X) | None (X) |
| | 30 | 6.8 | 4.0 | 41% | ○ | 72 | Produced (○) | Produced (○) |
| | 31 | 6.6 | 4.8 | 27% | ⊚ | 65 | None (X) | None (X) |
| | 32 | 6.6 | 4.9 | 26% | ⊚ | 65 | None (X) | None (X) |
| | 33 | 6.7 | 4.9 | 27% | ⊚ | 64 | None (X) | None (X) |
| | 34 | 6.7 | 5.1 | 24% | ⊚ | 67 | None (X) | None (X) |
| | 35 | 6.6 | 5.0 | 24% | ⊚ | 64 | None (X) | None (X) |
| | 36 | 6.7 | 4.9 | 27% | ⊚ | 64 | None (X) | None (X) |
| | 37 | 6.5 | 5.1 | 22% | ⊚ | 67 | None (X) | None (X) |
| | 38 | 6.6 | 4.8 | 27% | ⊚ | 65 | None (X) | None (X) |

TABLE 2-continued

| Classification | | Bonding strength (BST, g) | | | Ball hardness (Hv) | Chip crack | Shrinkage cavity |
|---|---|---|---|---|---|---|---|
| | | Before PCT | After PCT | Decreased Rate | Reliability | | | |
| | 39 | 6.8 | 5.1 | 25% | ◎ | 65 | None (X) | None (X) |
| | 40 | 6.8 | 5.2 | 24% | ◎ | 65 | None (X) | None (X) |
| | 41 | 6.9 | 5.3 | 23% | ◎ | 66 | None (X) | None (X) |
| | 42 | 6.9 | 5.3 | 23% | ◎ | 66 | None (X) | None (X) |
| | 43 | 6.9 | 5.3 | 23% | ◎ | 65 | None (X) | None (X) |
| | 44 | 6.9 | 5.3 | 23% | ◎ | 65 | None (X) | None (X) |
| | 45 | 7.0 | 3.4 | 51% | Δ | 72 | Produced (○) | Produced (○) |
| | 46 | 6.6 | 5.3 | 20% | ◎ | 64 | None (X) | None (X) |
| | 47 | 6.5 | 5.2 | 20% | ◎ | 64 | None (X) | None (X) |
| | 48 | 6.7 | 5.4 | 19% | ◎ | 65 | None (X) | None (X) |
| | 49 | 6.7 | 5.3 | 21% | ◎ | 65 | None (X) | None (X) |
| | 50 | 6.8 | 5.3 | 22% | ◎ | 71.5 | Produced (○) | Produced (○) |
| Comparison | 51 | 6.4 | 4.6 | 28% | ◎ | 62 | None (X) | None (X) |
| | 52 | 6.5 | 0.4 | 94% | X | 65 | None (X) | None (X) |
| | 53 | 6.7 | 0.3 | 96% | X | 67 | None (X) | None (X) |
| | 54 | 6.5 | 0.8 | 88% | X | 66 | None (X) | None (X) |
| | 55 | 6.6 | 1.2 | 82% | X | 68 | None (X) | None (X) |
| | 56 | 6.5 | 0.3 | 95% | X | 66 | None (X) | None (X) |
| | 57 | 6.7 | 0.6 | 91% | X | 69 | None (X) | None (X) |

First, regarding the reliability after the PCT, after the first additive ingredient to the third additive ingredient selected from the first group to the third group were added, the high humidity reliability of the Au—Ag based alloy wire was greatly improved. On the other hand, the Au—Ag alloy wire containing none of the first to third additive ingredients, i.e., the comparative examples 52 and 53, displayed poor high humidity reliability. However, when the first additive ingredient to the third additive ingredient selected from the first group to the third group was added, the high humidity reliability varied according to the contents of the first additive ingredient to the third additive ingredient.

The exemplary embodiments 1, 6, 11, and 16, where the content of the first additive ingredient selected from the first group ranged from 1~3 wt %, and the comparative examples 54~57, showed poor high humidity reliability. However, the exemplary embodiments 2~5, 7~10, 12~15, 17~44, and 46~50, where the first additive ingredients ranged from 5~20 wt %, showed excellent high humidity reliability despite the content of Ag. Particularly, in this case, the exemplary embodiments 25~42 where the second additive ingredient selected from the second group was added and the exemplary embodiments 43, 44 and 46~50 where the third additive ingredient selected from the third group was further to the second additive ingredient showed excellent high humidity reliability. However, the exemplary embodiment 45 displayed normal high humidity reliability.

Therefore, it can be noted that the first to third additive ingredients greatly contribute to the improvement of the high humidity reliability of the Au—Ag based alloy wire. However, the high humidity reliability of the Au—Ag based alloy wire was greatly improved when the content of the first additive ingredients was at least 3 wt %, and preferably equal to or greater than 5 wt %.

Second, with regard to chip cracks, no chip cracks occurred in all the exemplary embodiments except for the exemplary embodiments 5, 10, 15, 20, 30, 45 and 50 and the comparative examples. The exemplary embodiments 5, 10, 15, 20, 30, 45 and 50, where chip cracks occurred, had high ball hardness. Thus, it can be inferred that chip cracks occurred when the ball hardness was increased.

From the above results, no chip cracks occurred when the first additive ingredient was 15 wt % or less, and chip cracks likely occur in case where the first additive ingredient was 20 wt % (the exemplary embodiments 5, 10, 15 and 20). Even if the first additive ingredient was less than 15 wt %, chip cracks occurred when the second additive ingredients was 10000 wt·ppm (the exemplary embodiment 30) but no chip cracks occurred in case when the content of the second additive ingredient was less than 5000 wt·ppm. Also, when the content of the first additive ingredient was less than 15 wt % and the content of the second additive ingredient was less than 5000 wt·ppm, chip cracks occurred when the content of the third additive ingredient was greater than 500 wt·ppm (the exemplary embodiments 45 and 50) but no chip cracks occurred when the content of the third additive ingredient was less than 150 wt·ppm.

Accordingly, it can be noted that the first to third additive ingredients may influence the occurrence of chip cracks. Particularly, in order to prevent the occurrence of chip cracks, the content of the first additive ingredient should be 20 wt % or less, preferably less than 15 wt %, the content of the second additive ingredient should be 10000 wt·ppm or less, preferably, less than 5000 wt·ppm, and the content of the third additive ingredient should be 500 wt % or less, preferably less than 150 wt·ppm.

Third, with regard to ball shrinkage cavities, no ball shrinkage cavities were produced in the comparative examples and all of the exemplary embodiments except for the exemplary embodiments 30, 45, and 50. That is, ball shrinkage cavities were not produced when the content of the second additive ingredient was 5000 wt·ppm and less, but were produced when the content of the second additive ingredient was 10000 wt·ppm (the exemplary embodiment 30). Moreover, ball shrinkage cavities were not produced when the content of the third additive ingredient was 150 wt·ppm and less, but were produced in case where the content of the third additive ingredient was 500 wt·ppm and greater (the exemplary embodiments 45 and 50).

Thus, it can be noted that the second and third additive ingredients influence the forming of ball shrinkage cavities. Particularly, in order to prevent the occurrence of ball shrinkage cavities, the content of the second additive ingredient should be 10000 wt·ppm or less, preferably less than 5000 wt·ppm, and the content of the third additive ingredient should be 500 wt·ppm or less, and preferably, less than 150 wt·ppm.

Figure 3:
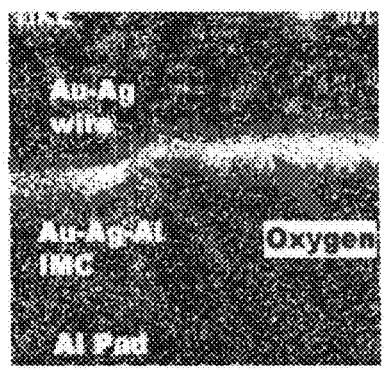
FIG. 3 is a photograph showing an oxygen map at a bonding interface of a conventional Au—Ag alloy wire and a semiconductor chip during a reliability test.
Figure 4:
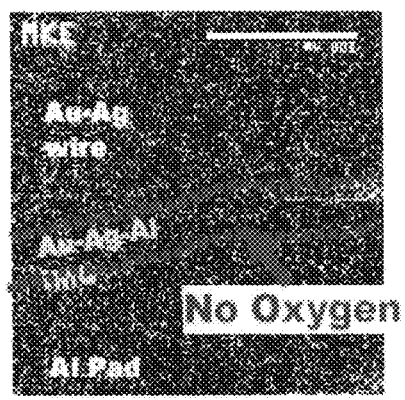
FIG. 4 is a photograph showing an oxygen map at a bonding interface of an Au—Ag based alloy wire according to an embodiment of the present invention, during a reliability test.

FIGS. 3 and 4 are photographs showing sections after conducting the reliability test for the comparative example 52 and the exemplary embodiment 2, respectively. In FIGS. 3 and 4, the Au—Ag alloy or the Au—Ag based alloy wire is bonded on an Al pad, and an Au—Ag—Al IMC could appear at an interface surface, which are denoted by dotted-lines.

When comparing FIGS. 3 and 4, oxygen is detected as a layer on the bonding surface of the wire and the semiconductor chip in the comparative example 52. Contrarily, oxygen is not detected from the bonding surface in the exemplary embodiment 2. Thus, it can be inferred that the decrease of the bonding strength in the conventional Au—Ag alloy wire is induced by an oxide layer formed in a high humidity ambient. In other words, the additive ingredients prevent the formation of the oxide layer on the bonding surfaces of the wires and the semiconductor chip, thereby improving the bonding strength.

A Au—Ag based alloy wire for a semiconductor package according to the present invention includes a proper amount of a first additive ingredient, so that high humidity reliability, and especially a bonding strength, of the semiconductor package is improved while effectively preventing the occurrence of chip cracks and ball shrinkage cavities.

Moreover, the Au—Ag based alloy wire for a semiconductor package according to the present invention further includes a proper amount of a second additive ingredient and a third additive ingredient to effectively prevent the occurrence of chip cracks and ball shrinkage cavities and further improving the high humidity reliability of the semiconductor package.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A wire for a semiconductor package having a gold (Au)-silver (Ag) based alloy comprising:
    10~40 wt % of silver (Ag),
    greater than 5 wt % of a first additive ingredient of palladium (Pd), and
    a balance of gold (Au) or a balance of gold (Au) and impurities unavoidably contained in the gold (Au)-silver (Ag) based alloy,
    wherein the first additive ingredient in the gold (Au)-silver (Ag) based alloy suppresses formation of oxides at the bonding interfaces between the wire and a pad of the semiconductor package.

2. The wire of claim 1, wherein a ratio of the first additive ingredient to the silver (Ag) ranges from 1/4 to 1/2.

3. The wire of claim 1, wherein the first additive ingredient of palladium (Pd) is at a concentration greater than 5 wt % but at or less than 15 wt %.

4. The wire of claim 1 comprising: 10~40 wt % of silver (Ag), greater than 5 wt % of a first additive ingredient of palladium (Pd), and a balance of gold (Au).

5. The wire of claim 1 comprising: 10~40 wt % of silver (Ag), greater than 5 wt % of a first additive ingredient of palladium (Pd), and a balance of gold (Au) and impurities unavoidably contained in the gold (Au)-silver (Ag) based alloy.

6. A wire for a semiconductor package having a gold (Au)-silver (Ag) based alloy comprising:
    10~40 wt % of silver (Ag),
    greater than 5 wt % of a first additive ingredient of palladium (Pd),
    10~5000 wt·ppm of a second additive ingredient of at least one element selected from among a second group of elements consisting of nickel (Ni), tin (Sn), niobium (Nb), molybdenum (Mo), technetium (Tc), ruthenium (Ru), Rhodium (Rh), Vanadium (V), and cobalt (Co) and a balance of gold (Au), and
    a balance of gold (Au) or a balance of gold (Au) and impurities unavoidably contained in the gold (Au)-silver (Ag) based alloy,
    wherein the first additive ingredient in the gold (Au)-silver (Ag) based alloy suppresses formation of oxides at the bonding interfaces between the wire and a pad of the semiconductor package.

7. The wire of claim 6, wherein a ratio of the first additive ingredient to the silver (Ag) ranges from 1/4 to 1/2.

8. The wire of claim 6 comprising: 10~40 wt % of silver (Ag), greater than 5 wt % of a first additive ingredient of palladium (Pd), 10~5000 wt·ppm of a second additive ingredient of at least one element selected from among a second group of elements consisting of nickel (Ni), tin (Sn), niobium (Nb), molybdenum (Mo), technetium (Tc), ruthenium (Ru), Rhodium (Rh), Vanadium (V), and cobalt (Co), and a balance of gold (Au).

9. The wire of claim 6 comprising: 10~40 wt % of silver (Ag), greater than 5 wt % of a first additive ingredient of palladium (Pd), 10~5000 wt·ppm of a second additive ingredient of at least one element selected from among a second group of elements consisting of nickel (Ni), tin (Sn), niobium (Nb), molybdenum (Mo), technetium (Tc), ruthenium (Ru), Rhodium (Rh), Vanadium (V), and cobalt (Co), and a balance of gold (Au) and impurities unavoidably contained in the gold (Au)-silver (Ag) based alloy.

10. A wire for a semiconductor package having a gold (Au)-silver (Ag) based alloy comprising:
    10~40 wt % of silver (Ag),
    greater than 5 wt % of a first additive ingredient of palladium (Pd),
    5~150 wt·ppm of a third additive ingredient of at least one element selected from among a third group of elements consisting of lanthanum (La), cerium (Ce), calcium (Ca), magnesium (Mg), strontium (Sr), and barium (Ba), and
    a balance of gold (Au) or a balance of gold (Au) and impurities unavoidably contained in the gold (Au)-silver (Ag) based alloy,
    wherein the first additive ingredient in the gold (Au)-silver (Ag) based alloy suppresses formation of oxides at the bonding interfaces between the wire and a pad of the semiconductor package.

11. The wire of claim 10, wherein a ratio of the first additive ingredient to the silver (Ag) ranges from 1/4 to 1/2.

12. The wire of claim 10 comprising: 10~40 wt % of silver (Ag), greater than 5 wt % of a first additive ingredient of palladium (Pd), 5~150 wt·ppm of a third additive ingredient of at least one element selected from among a third group of elements consisting of lanthanum (La), cerium (Ce), calcium (Ca), magnesium (Mg), strontium (Sr), and barium (Ba), and a balance of gold (Au).

13. The wire of claim 10 comprising: 10~40 wt % of silver (Ag), greater than 5 wt % of a first additive ingredient of palladium (Pd), 5~150 wt·ppm of a third additive ingredient of at least one element selected from among a third group of elements consisting of lanthanum (La), cerium (Ce), calcium (Ca), magnesium (Mg), strontium (Sr), and barium (Ba), and a balance of gold (Au) and impurities unavoidably contained in the gold (Au)-silver (Ag) based alloy.

14. A wire for a semiconductor package having a gold (Au)-silver (Ag) based alloy comprising:
10~40 wt % of silver (Ag),
greater than 5 wt % of a first additive ingredient of palladium (Pd),
10~5000 wt·ppm of a second additive ingredient of at least one element selected from among a second group of elements consisting of nickel (Ni), tin (Sn), niobium (Nb), molybdenum (Mo), technetium (Tc), ruthenium (Ru), Rhodium (Rh), Vanadium (V), and cobalt (Co),
5~150 wt·ppm of a third additive ingredient of at least one element selected from among a third group of elements consisting of lanthanum (La), cerium (Ce), calcium (Ca), magnesium (Mg), strontium (Sr), and barium (Ba), and
a balance of gold (Au) or a balance of gold (Au) and impurities unavoidably contained in the gold (Au)-silver (Ag) based alloy,
wherein the first additive ingredient in the gold (Au)-silver (Ag) based alloy suppresses formation of oxides at the bonding interfaces between the wire and a pad of the semiconductor package.

15. The wire of claim 14, wherein a ratio of the first additive ingredient to the silver (Ag) ranges from 1/4 to 1/2.

16. The wire of claim 14 comprising: 10~40 wt % of silver (Ag), greater than 5 wt % of a first additive ingredient of palladium (Pd), 10~5000 wt·ppm of a second additive ingredient of at least one element selected from among a second group of elements consisting of nickel (Ni), tin (Sn), niobium (Nb), molybdenum (Mo), technetium (Tc), ruthenium (Ru), Rhodium (Rh), Vanadium (V), and cobalt (Co), 5~150 wt·ppm of a third additive ingredient of at least one element selected from among a third group of elements consisting of lanthanum (La), cerium (Ce), calcium (Ca), magnesium (Mg), strontium (Sr), and barium (Ba), and a balance of gold (Au).

17. The wire of claim 14 comprising: 10~40 wt % of silver (Ag), greater than 5 wt % of a first additive ingredient of palladium (Pd), 10~5000 wt·ppm of a second additive ingredient of at least one element selected from among a second group of elements consisting of nickel (Ni), tin (Sn), niobium (Nb), molybdenum (Mo), technetium (Tc), ruthenium (Ru), Rhodium (Rh), Vanadium (V), and cobalt (Co), 5~150 wt·ppm of a third additive ingredient of at least one element selected from among a third group of elements consisting of lanthanum (La), cerium (Ce), calcium (Ca), magnesium (Mg), strontium (Sr), and barium (Ba), and a balance of gold (Au) and impurities unavoidably contained in the gold (Au)-silver (Ag) based alloy.

* * * * *